United States Patent
Godycki

(10) Patent No.: US 10,707,822 B1
(45) Date of Patent: Jul. 7, 2020

(54) DYNAMIC POWER SUPPLY FOR POLAR MODULATION TRANSMITTERS AND ENVELOPE TRACKING TRANSMITTERS

(71) Applicant: Eridan Communications, Inc., Santa Clara, CA (US)

(72) Inventor: Waclaw Godycki, Portland, OR (US)

(73) Assignee: Eridan Communications, Inc., Mountain View, CA (US)

( * ) Notice: Subject to any disclaimer, the term of this patent is extended or adjusted under 35 U.S.C. 154(b) by 0 days.

(21) Appl. No.: 16/563,847

(22) Filed: Sep. 7, 2019

(51) Int. Cl.
*H03F 1/02* (2006.01)
*H03G 3/00* (2006.01)
*G05F 1/565* (2006.01)
*G05F 1/575* (2006.01)

(52) U.S. Cl.
CPC .............. *H03G 3/004* (2013.01); *G05F 1/565* (2013.01); *G05F 1/575* (2013.01)

(58) Field of Classification Search
CPC .......... H03F 1/0227; H03F 3/245; H03F 3/24; H03F 1/02; G05F 1/565; G05F 1/575; G05F 3/08; H03G 3/004; H04B 1/0483
See application file for complete search history.

(56) References Cited

U.S. PATENT DOCUMENTS

| | | | |
|---|---|---|---|
| 2013/0229229 A1* | 9/2013 | Park ..................... | H03F 1/0227 330/127 |
| 2014/0117955 A1* | 5/2014 | Zoso ..................... | H02M 3/157 323/271 |
| 2016/0241131 A1* | 8/2016 | Carli .................... | H02M 1/4258 |
| 2017/0179815 A1* | 6/2017 | Huang .................. | H03H 11/02 |
| 2019/0140597 A1* | 5/2019 | Lin ....................... | G05F 1/565 |

* cited by examiner

*Primary Examiner* — Thanh C Le
(74) *Attorney, Agent, or Firm* — Patent Law Professionals, P.C.; William E. Winters

(57) ABSTRACT

A dynamic power supply (DPS) for polar modulation transmitters and envelope tracking (ET) transmitters includes a direct current (DC)-DC converter, a linear amplitude modulator (LAM) connected in series with the DC-DC converter, and a controller that dynamically controls both the switching of the DC-DC converter and the magnitude of the LAM's reference voltage, depending on time-varying changes in an input envelope voltage Venv. The DC-DC converter includes a high-power buck switching stage and an output energy storage network having a third-order or higher low-pass filter (LPF). The third-order or higher LPF filters out switching noise and ripple from the switching voltage produced by the high-power buck switching stage, and in one embodiment of the invention is augmented by a damping network that eliminates undesirable ringing at the power supply input of the LAM, thereby increasing efficiency and DPS conversion precision.

25 Claims, 9 Drawing Sheets

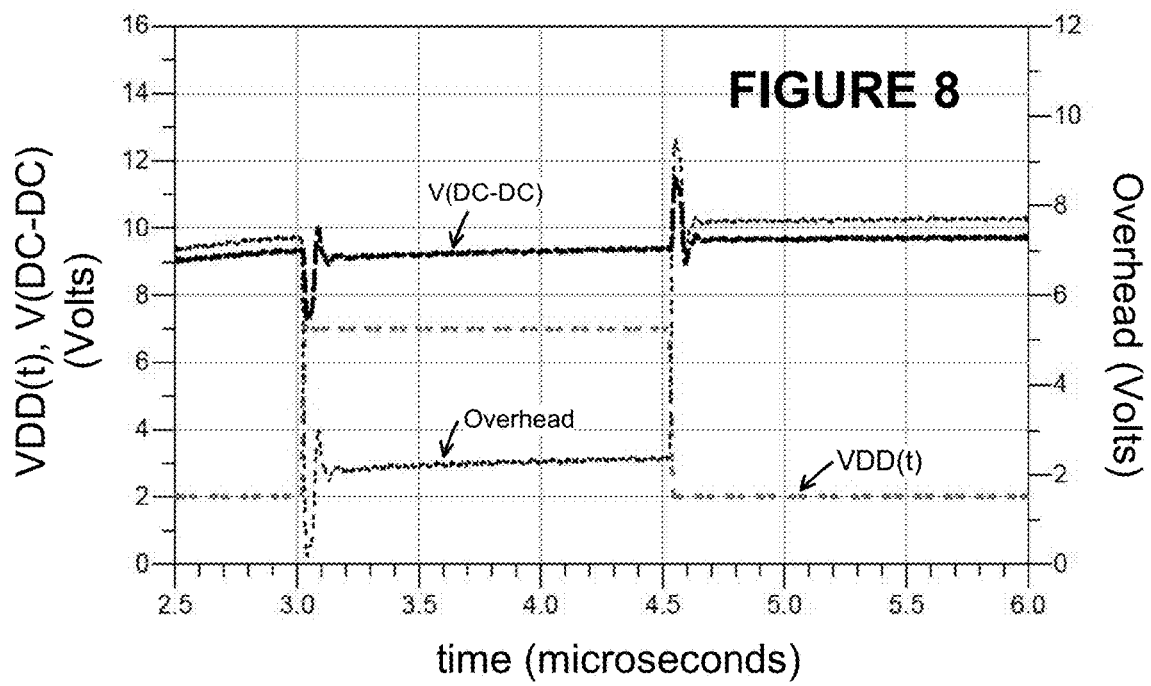
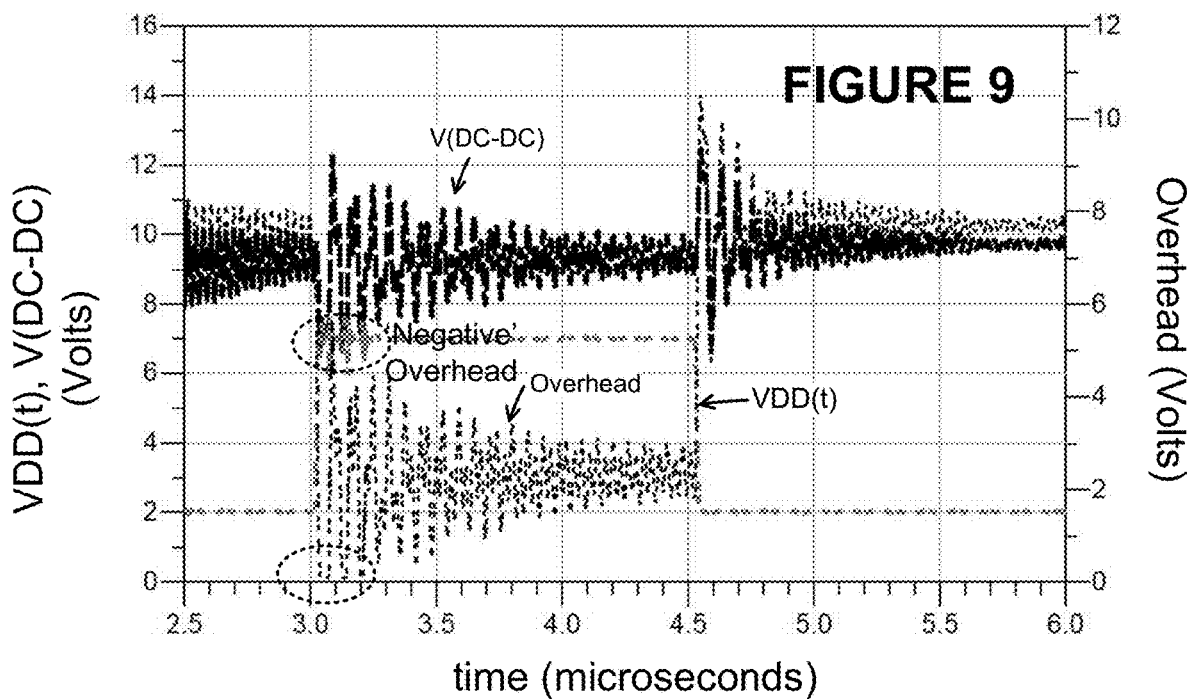

ALTERNATIVE OUTPUT
STORAGE AND DAMPING
NETWORK 1200
(Damping on Both Stages)

DYNAMIC POWER SUPPLY FOR POLAR MODULATION TRANSMITTERS AND ENVELOPE TRACKING TRANSMITTERS

BACKGROUND OF THE INVENTION

Dynamic power supplies (DPS) are used in modern radio frequency (RF) transmitters, in particular, polar modulation transmitters and envelope tracking ET transmitters, to help increase energy efficiency. In the polar modulation transmitter 100 (see FIG. 1), the polar modulation transmitter's PA 102 comprises an energy-efficient nonlinear PA (for example, a Class-E or Class-F switch mode PA) that modulates a "signal envelope" carried by the DPS voltage VDD(t) produced by its DPS 106 onto the polar modulation transmitter's RF output $RF_{OUT}$. The DPS voltage VDD(t) in the ET transmitter (see FIG. 2) also tracks the input signal envelope voltage Venv. However, unlike the polar modulation transmitter 100, the ET transmitter 100 employs a linear PA 202 (for example, a Class-A, B or AB linear PA), which does not operate as a modulator. Instead, the linear PA 202 operates as a controlled current source and the ET transmitter's 200's DPS voltage VDD(t) tracks the input signal envelope voltage only for the purpose of maintaining the linear PA 202 just outside of saturation, where it operates linearly and near peak efficiency. In other words, while the polar modulation transmitter 100 achieves high energy efficiency by virtue of its energy-efficient nonlinear PA 102, the ET transmitter 200 achieves high energy efficiency in spite of its energy-inefficient linear PA 202 by continually forcing its linear PA 202 to operate at the boundary of saturation.

The accuracy of the signal envelope produced in the RF output $RF_{OUT}$ in the polar modulation transmitter 100 is highly dependent upon the precision of its DPS 106. On the other hand, because the DPS voltage VDD(t) produced by the DPS 206 in the ET transmitter 200 is not used to modulate the ET transmitter's RF output $R_{FOUT}$, and need only control the DPS voltage VDD(t) so that the linear PA 202 does not saturate, the DPS 206 in the ET transmitter 200 does not have to be as precise as the DPS 106 in the polar modulation transmitter 100. Nevertheless, the more precise the DPS 206 is made to be, the more energy efficient the ET transmitter 200 becomes. Accordingly, whether used in a polar modulation transmitter or in an ET transmitter, it is desirable for the DPS to be both energy efficient and precise.

DPSs can be constructed from DC-DC converters, linear regulators, or a combination of both. DC-DC converters employ transistors that are controlled to operate as switches in order to achieve a high energy efficiency. However, they are not very precise and can produce a significant amount of switching noise and ripple at their outputs. The linear regulator avoids this problem by using an error amplifier and negative feedback to control load current flowing through a pass transistor disposed between the regulator's input and output. The pass transistor is not switched on and off, as are the transistors in DC-DC converters. Instead, the pass transistor is controlled to operate as a variable resistor. Unfortunately, this results in power dissipation and a reduction in energy efficiency, particularly when the magnitude of the linear regulator's output voltage (which is the DPS voltage VDD(t) when the linear regulator serves as a DPS) is significantly lower than its input DC voltage, which can occur frequently in an RF transmitter.

To overcome this problem but still enjoy the precision that the linear regulator offers, the linear regulator 304 can be connected in parallel with the DC-DC converter 302, as illustrated in FIG. 3. According to this approach, the DC-DC converter 302 operates as a current source, supplying most of the load current $i_{OUT}$, and the linear regulator 304 serves as a voltage regulator, sinking and sourcing current to and from the DPS's output node 306, as necessary, to remove the switching noise and ripple that would otherwise be present in VDD(t) if only the DC-DC converter 302 was present. A further understanding of conventional DPSs and how they are constructed and operate may be found in the book: "*Dynamic Power Supply Transmitters, Envelope Tracking, Direct Polar and Hybrid Combinations*," The Cambridge RF and Microwave Series, First Edition, Cambridge University Press (2015), by Earl W. McCune.

One problem the parallel DC-DC converter/linear regulator DPS 300 has, however, is that whenever the linear regulator 304 is sinking current from the output node 306, that current is diverted away from the load (the PA 308), i.e., does not flow into the PA 308. Since the diverted current does not contribute to any useful work, the energy efficiency of the parallel DC-DC converter/linear regulator DPS 300 is therefore compromised. If the diverted current is large and frequent, the very reason for connecting the DC-DC converter 302 and linear regulator 304 in parallel in the first place can be defeated. The amount of diverted current can be ameliorated to some extent by increasing the switching frequency $f_{SW}$ of the DC-DC converter 302, which would then result in a lower ripple voltage. However, increasing the switching frequency $f_{SW}$ negatively impacts the DC-DC converter's 302's efficiency and undesirably reduces it output dynamic range.

Another limitation the parallel DC-DC converter/linear regulator DPS 300 has is that it is incapable of operating with high precision and high energy efficiency over a wide bandwidth, which is an important set of attributes for a DPS to have, particularly when the DPS is used in a polar modulation transmitter, given that the bandwidth of the envelope signal is often very wide and due to strict signal accuracy requirements often imposed by standards. In a telecommunications system application supporting the long term evolution (LTE) air interface, for example, which has channel bandwidths up to 20 MHz, the DPS should have a bandwidth several times that, in order for it to be capable of producing an accurate DPS voltage VDD(t) at its output. Unfortunately, designing a parallel DC-DC converter/linear regulator DPS that can operate with this degree of precision and with high energy efficiency over such a wide bandwidth is not easily realized. The present invention provides solutions to this problem.

BRIEF SUMMARY OF THE INVENTION

A dynamic power supply (DPS) for polar modulation transmitters and envelope tracking (ET) transmitters is disclosed. The DPS includes a direct current (DC)-DC converter, a linear amplitude modulator (LAM) connected in series with the DC-DC converter, and a controller that dynamically controls both the switching of the DC-DC converter and the magnitude of the LAM's reference voltage, depending on time-varying changes in an input envelope voltage Venv. The DC-DC converter includes a high-power buck switching stage and an output energy storage network having a third-order or higher low-pass filter (LPF). The third-order or higher LPF filters out switching noise and ripple from the switching voltage produced by the high-power buck switching stage. Employing the third-order or higher LPF and operating the DC-DC converter open loop afford the DPS the ability to operate over a wide bandwidth, making it well-suited for polar modulation transmitters and ET transmitters in W-CDMA and LTE telecommunications applications. In one embodiment of the invention the output energy storage network in the DC-DC converter is supplemented by a damping network that eliminates undesirable ringing at the node connecting the output of the DC-DC converter to the power supply input of the LAM, thereby increasing efficiency and DPS conversion precision.

Further details of the invention, including a detailed description of the above-summarized and other exemplary embodiments of the invention, will now be described with reference to the accompanying drawings, in which like reference numbers are used to indicate identical or functionally similar elements.

BRIEF DESCRIPTION OF THE DRAWINGS

FIG. 8 is a signal diagram illustrating how the damping network in the energy storage and damping network depicted in FIG. 6 essentially eliminates all ringing at the power supply input of the LAM of the DPS depicted in FIGS. 4 and 5;

FIG. 9 is a signal diagram illustrating how ringing would occur at the power supply input of the LAM in the DPS depicted in FIGS. 4 and 5, if the R-C damping network was not present in the energy storage and damping network;

DETAILED DESCRIPTION

Figure 1:
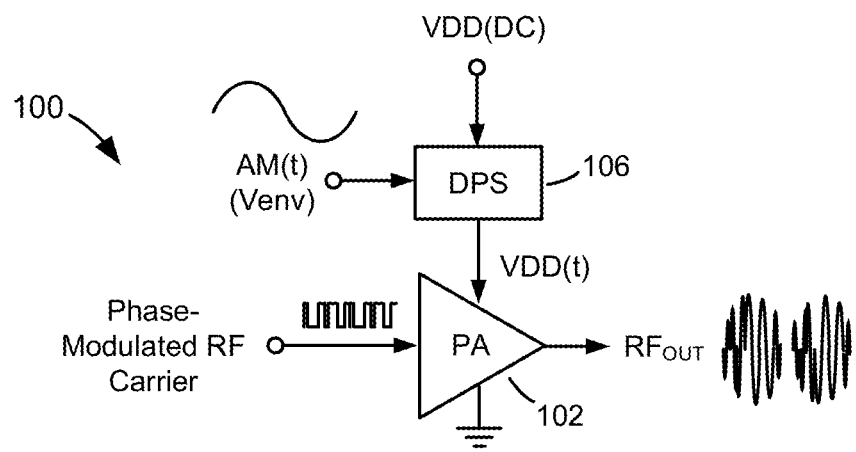
FIG. 1 is a simplified drawing of a polar modulation transmitter, highlighting how the dynamic power supply (DPS) voltage VDD(t) produced by its DPS is supplied to the power supply port of the polar modulation transmitter's nonlinear power amplifier (PA)
Figure 2:
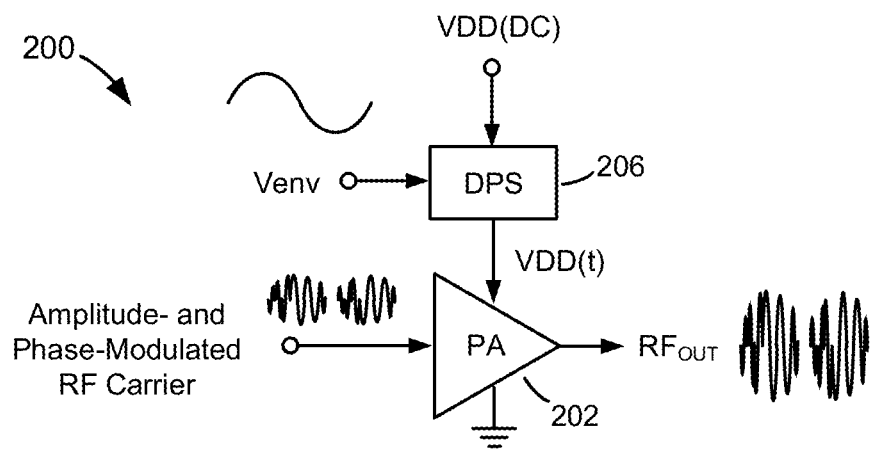
FIG. 2 is a simplified drawing of an envelope tracking (ET) transmitter, highlighting how the DPS voltage VDD(t) produced by its DPS is used to enhance the efficiency of its linear PA.
Figure 3:
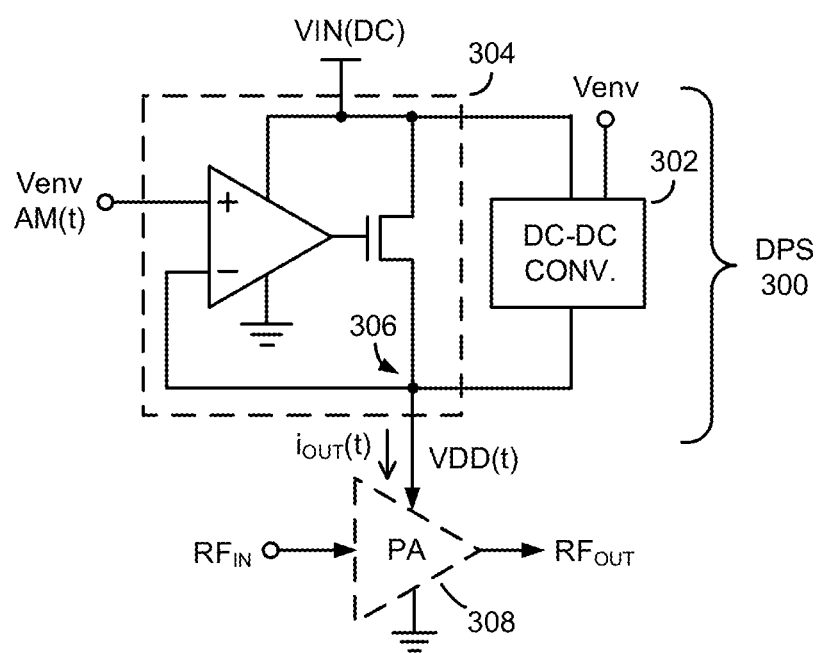
FIG. 3 is a drawing illustrating how a direct current (DC)-DC switching converter with high energy efficiency can be combined in parallel with a linear regulator to produce a DPS.
Figure 4:
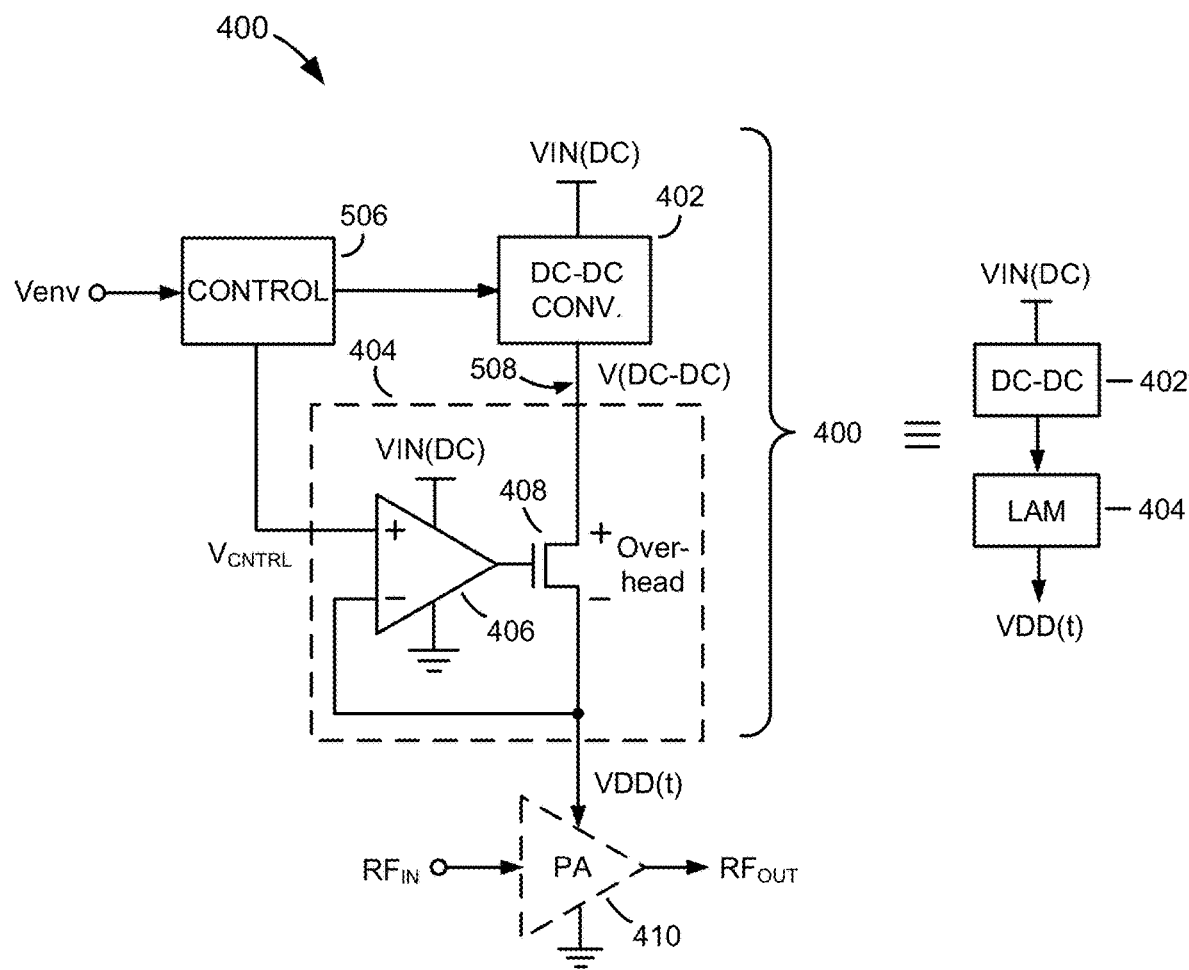
FIG. 4 is a drawing depicting a DPS, according to one embodiment of the invention.

Referring to FIG. 4, there is shown a dynamic power supply (DPS) 400 according to one embodiment of the present invention. The DPS 400 comprises a DC-DC converter 402 connected in series with a linear amplitude modulator (LAM) 404, which in turn comprises an operational amplifier (opamp) 406 and pass transistor 408.

Figure 5:
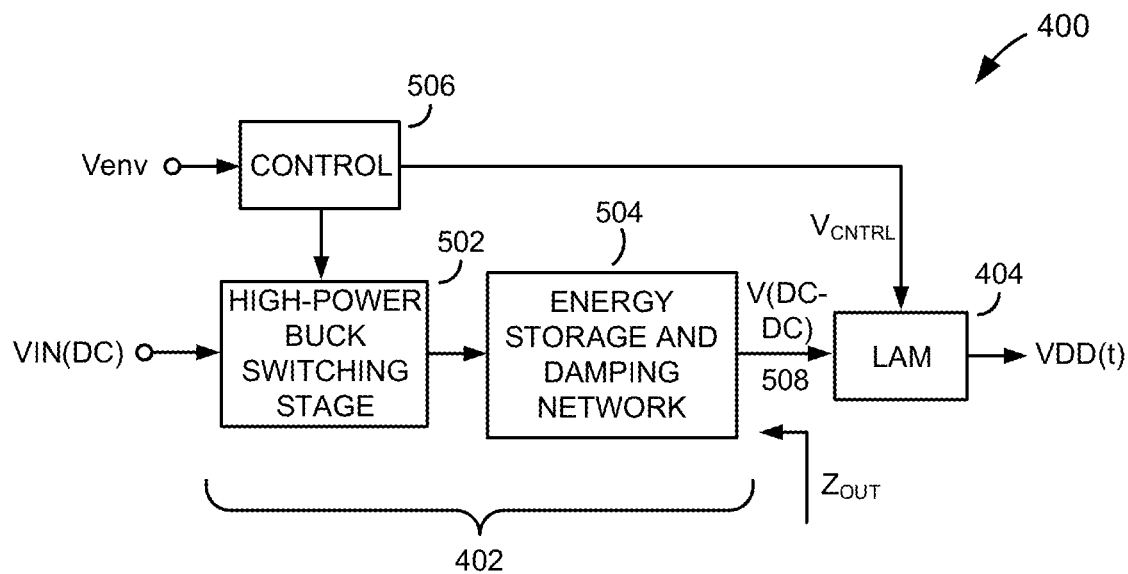
FIG. 5 is a block diagram of the DPS depicted in FIG. 4, further highlighting the series connection of the DPS's DC-DC converter and linear amplitude modulator (LAM), and further illustrating the principal components of the DPSs' DC-DC converter.

FIG. 5 is block drawing of the DPS 400, showing how the DC-DC converter 402 comprises a high-power buck switching stage 502 and energy storage and damping network 504, and how the DPS 400 further includes a controller 506. The controller 506 comprises a pulse-width modulator (PWM) or, in another embodiment of the invention a pulse density modulator (PDM), that generates drive signals for driving the power transistors in the high-power buck switching stage 502. The controller 506 modulates the pulse widths or pulse density of the drive signals, depending on whether PWM or PDM is used, according to an input envelope voltage Venv, and, as will be explained in more detail below, dynamically controls a control voltage $V_{CNTRL}$ to the LAM 404 to prevent the LAM 404 from losing regulation while at the same time minimizing power dissipation in the LAM's 404's pass transistor 408.

Figure 6:
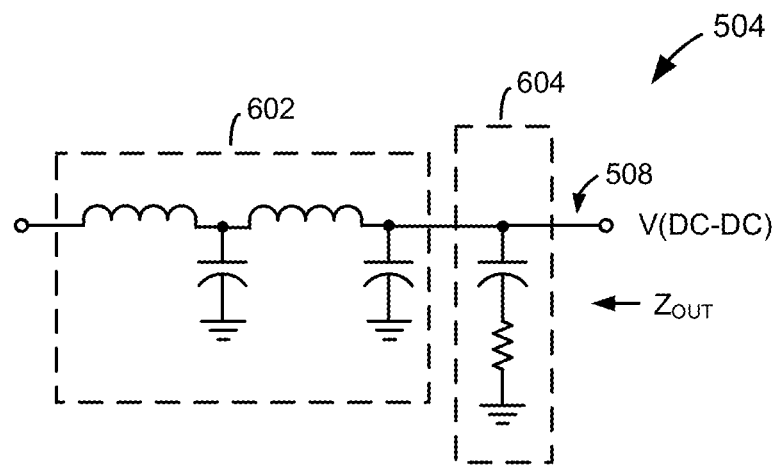
FIG. 6 is a schematic drawing illustrating how the energy storage and damping network in the DC-DC converter of the DPS depicted in FIG. 5 is implemented in one embodiment of the invention.
Figure 7:
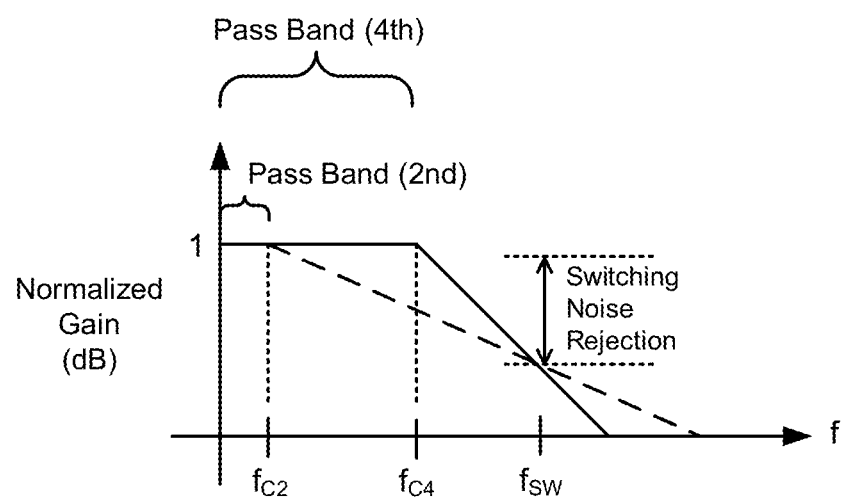
FIG. 7 is a frequency response diagram illustrating how the third-order or greater LPF in the energy storage and damping network of the DC-DC converter depicted in FIG. 5 is able to achieve a significantly wider frequency response compared to if only a second-order filter with the same switching noise suppression were to be used.

The switching voltage produced at the output of the high-power buck switching stage 502 is filtered through the energy storage and damping network 504 to produce a DC-DC converter output voltage VDD(DC-DC) that generally follows the signal envelope voltage Venv. FIG. 6 is a schematic drawing illustrating how in one embodiment of the invention the energy storage and damping network 504 comprises a third-order or greater low-pass filter (LPF) 602 (in this particular exemplary embodiment, a fourth-order L-C filter having a two-section ladder topology) combined with a damping network 604 (in this particular exemplary embodiment, an R-C filter). As illustrated in FIG. 7, the third-order or greater LPF 602 affords the DC-DC converter 402 the ability to achieve a significantly wider frequency response, compared to if only a second-order filter with the same switching noise suppression were to be used. To ensure that the DC-DC converter's 402's frequency response is not compromised and to avoid feedback stability problems, in a preferred embodiment of the invention the DC-DC converter 402 is configured to operate open loop, i.e., without negative feedback. It should be mentioned that whereas the exemplary energy storage and damping network 504 illustrated in FIG. 6 comprises a passive filter constructed entirely from passive components, it (or some portion of it, for example, the damping network 604 portion) could possibly be constructed using one or more active filters.

The LAM 404 is responsible for removing any remaining ripple and residual switching noise present in the DC-DC converter output voltage VDD(DC-DC). The LAM's 404's opamp 406 serves as an error amplifier that continuously adjusts its output voltage, i.e., the DPS output voltage VDD(t), so that the fed back voltage applied to its inverting input terminal is forced to equal and dynamically follow the control voltage $V_{CNTRL}$ applied to its non-inverting input terminal. The controller 506 controls the control voltage $V_{CNTRL}$ so that it generally follows the envelope voltage Venv. In one embodiment of the invention the controller 506 is further configured to include an offset voltage in the control voltage $V_{CNTRL}$, and to dynamically control the offset voltage so that the overhead voltage V(DC-DC)–VDD (t) dropped across the pass transistor 408 in the LAM 404 always remains positive (i.e., never becomes negative), thereby preventing the LAM 404 from ever losing regulation. (Note that because the control voltage $V_{CNTRL}$ serves as the reference voltage for the opamp 406 in the LAM 404 and because it varies with the envelope voltage Venv, the control voltage $V_{CNTRL}$ may be also referred to as the 'dynamic reference voltage' for the LAM 404.)

In addition to generating the dynamic reference voltage for the LAM 404, in one embodiment of the invention the controller 506 is further designed to: 1) delay the dynamic reference voltage $V_{CNTRL}$ applied to the LAM 404; and 2) provide a waveform shaping function for the envelope voltage Venv directed to the high-power buck switching stage 502 portion of the DPS 500. Delaying the dynamic reference voltage $V_{CNTRL}$ accounts for (i.e., balances out) the delay introduced by the LC filters in the energy storage and damping network 504, thereby ensuring that the signal waveforms produced at the outputs the high-power buck switching stage 502 and LAM 404 are in timed alignment. The waveform shaping function serves to temporarily increase the overhead voltage at the input of the LAM during times the high-power buck switching stage 502 becomes unable to produce very small voltages at its output. Because the increase in the overhead voltage is temporary and endures only for a very brief time, the impact on energy efficiency is de minimis.

Using its built-in power supply rejection capability, the LAM 404 filters the DC-DC converter output voltage VDD (DC-DC) supplied to it from the DC-DC converter 402, removing any remaining ripple and residual switching noise and producing the final DPS voltage VDD(t) for the load, which may be the linear PA in an envelope tracking (ET) transmitter, the nonlinear PA in a polar modulation transmitter, or the PA in any other transmitter that exploits the advantages of a DPS. Note that by using this series connection, all of the DC-DC output current flows into the RF generating load at all times, acting to take full advantage of the DC-DC conversion efficiency. In one embodiment of the invention the LAM's 404's opamp 406 comprises a silicon opamp and its pass transistor 408 is a gallium nitride high electron mobility transistor (GaN HEMT). The silicon opamp 406/GaN HEMT pass transistor 408 combination results in the LAM 404 being capable of achieving an operating bandwidth of 900 MHz, i.e., nearly 1 GHz. This bandwidth is nearly 10× greater than if the LAM was made only from silicon semiconductor devices.

One undesirable side effect of connecting a DC-DC converter in series with a linear regulator is that the peaks in the output impedance $Z_{OUT}$ of the DC-DC converter are excited whenever there is even the slightest of mismatch in the current being supplied by the DC-DC converter and the current that the linear regulator must deliver to the load. This current mismatch is an AC phenomenon and manifests itself as ringing at the node that connects the output of the DC-DC converter to the power supply input of the linear regulator. The ringing is highly undesirable since, absent some form of intervention, can cause the linear regulator to lose regulation and the DPS to become inoperable. One way the ringing can be avoided is to simply increase the voltage headroom at the input of the linear regulator. However, that approach is undesirable since it results in an increase in power dissipation in the linear regulator's pass transistor and consequently a reduction in overall energy efficiency of the DPS. A better approach, and the approach used in the present invention, is to include the damping network 604 in the energy storage and damping network 504 (see FIG. 6), e.g., at node 508. As can be seen by comparing FIG. 8 (damping network 604 present) to FIG. 9 (no damping network present), the damping network 604 has the effect of essentially eliminating all ringing at node 508. With the ringing eliminated and the controller's 506's beforehand knowledge of what the DPS output voltage VDD(t) should be at any given time, the controller 506 then controls the overhead voltage VDD(t)–V(DC-DC) so that it always remains positive and at the same time dynamically minimizes it so that the LAM 404 always operates near peak efficiency, i.e., so that the LAM's 404's pass transistor 408 does not dissipate any more power than necessary for the LAM 404 to maintain regulation.

Figure 10:
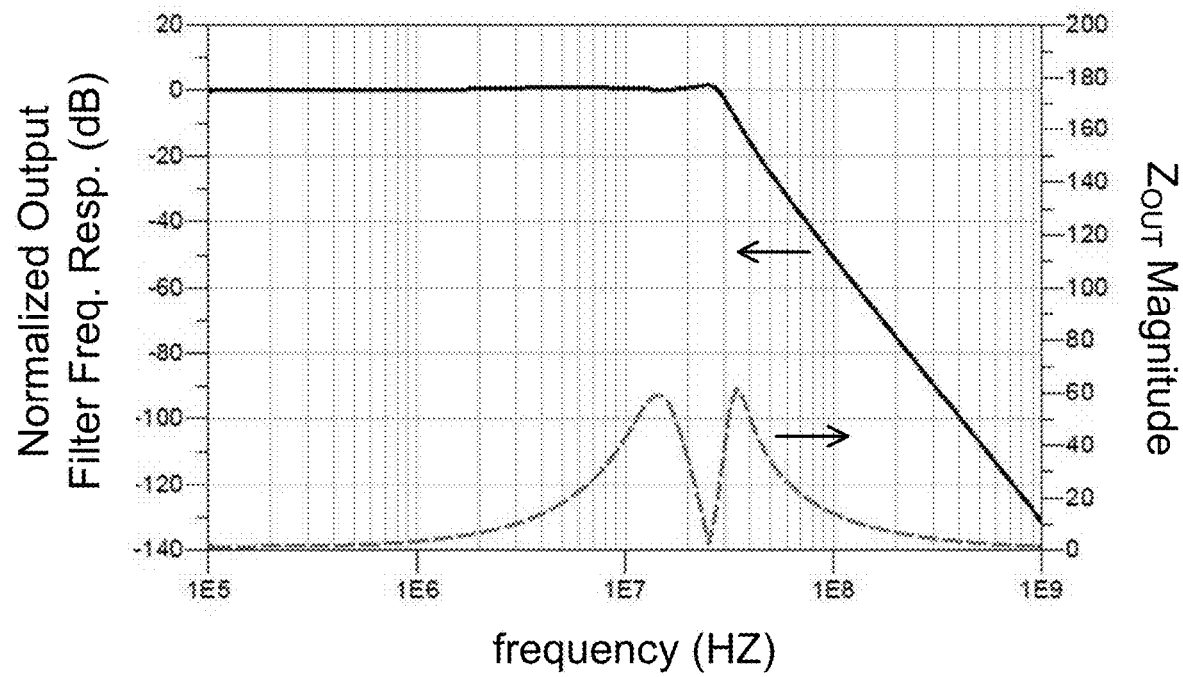
FIG. 10 is a frequency response and impedance diagram illustrating how the output impedance $Z_{OUT}$ looking into the energy storage and damping network of the DC-DC converter of the DPS depicted in FIG. 4 varies as a function of frequency when the R-C damping network is present in the energy storage and damping network, as illustrated in FIG. 6.
Figure 11:
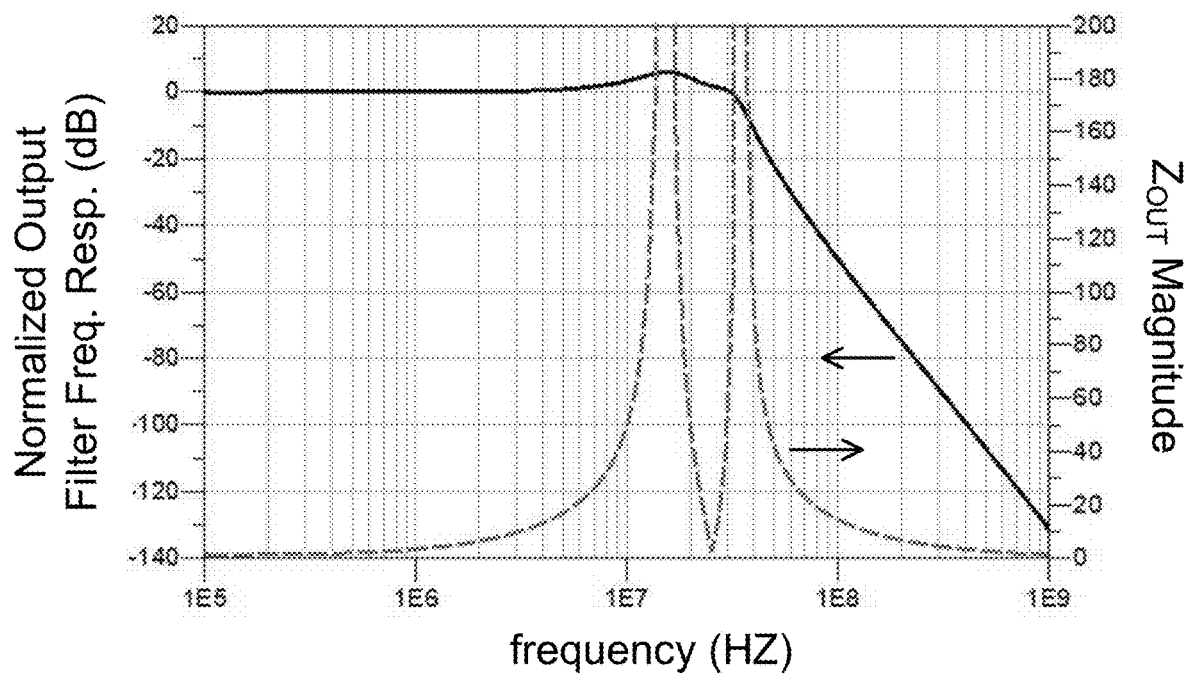
FIG. 11 is a frequency response and impedance diagram illustrating how the output impedance $Z_{OUT}$ looking into the energy storage and damping network of the DC-DC converter of the DPS depicted in FIG. 4 varies as a function of frequency when the R-C damping network is not included in the energy storage and damping network.
Figure 12:
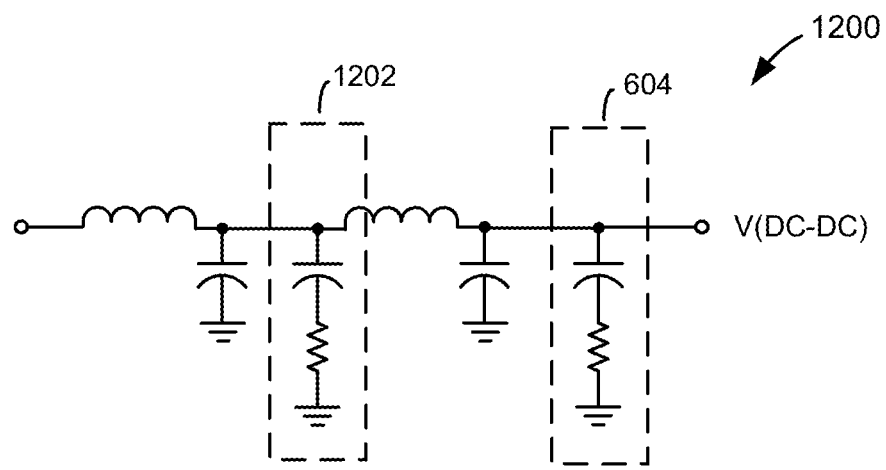
FIG. 12 a schematic drawing illustrating how the energy storage and damping network in the DC-DC converter of the DPS depicted in FIG. 5 can be implemented to further dampen ringing, in accordance with another embodiment of the invention.

The effectiveness of the damping network 604 can also be seen in the frequency response and output impedance simulation results in FIGS. 10 and 11. When the R-C damping network 604 is present (FIG. 10), the magnitude of the output impedance $Z_{OUT}$ looking into the energy storage and damping network 504 is seen to be substantially less than the magnitude of impedance $Z_{OUT}$ when no R-C damping network 604 is present (FIG. 11). In effect, the R-C damping network 604 'de-Qs' (i.e., lowers the Q factor of) the third-order or greater LPF 602 during times there is an AC current imbalance between what is being supplied by the DC-DC converter 402 and what the LAM 404 needs to deliver to the load, so that the large resonant peaks that would otherwise be present during the AC imbalance are removed. Although adding the R-C damping network 604 does result in a slight increase in power dissipation, that increase is significantly less than the increase in power dissipation that would result by increasing the voltage headroom at the output of the DC-DC converter 402 to address the ringing. It should be mentioned that although a single R-C damping network 604 is sufficient in most circumstances to dampen the ringing and allow the controller 506 to dynamically minimize the required overhead voltage VDD(t)–V(DC-DC), a second R-C damping network 1202 (see FIG. 12) can be included in the third-order or greater LPF 602 to dampen the ringing even further.

Figure 13:
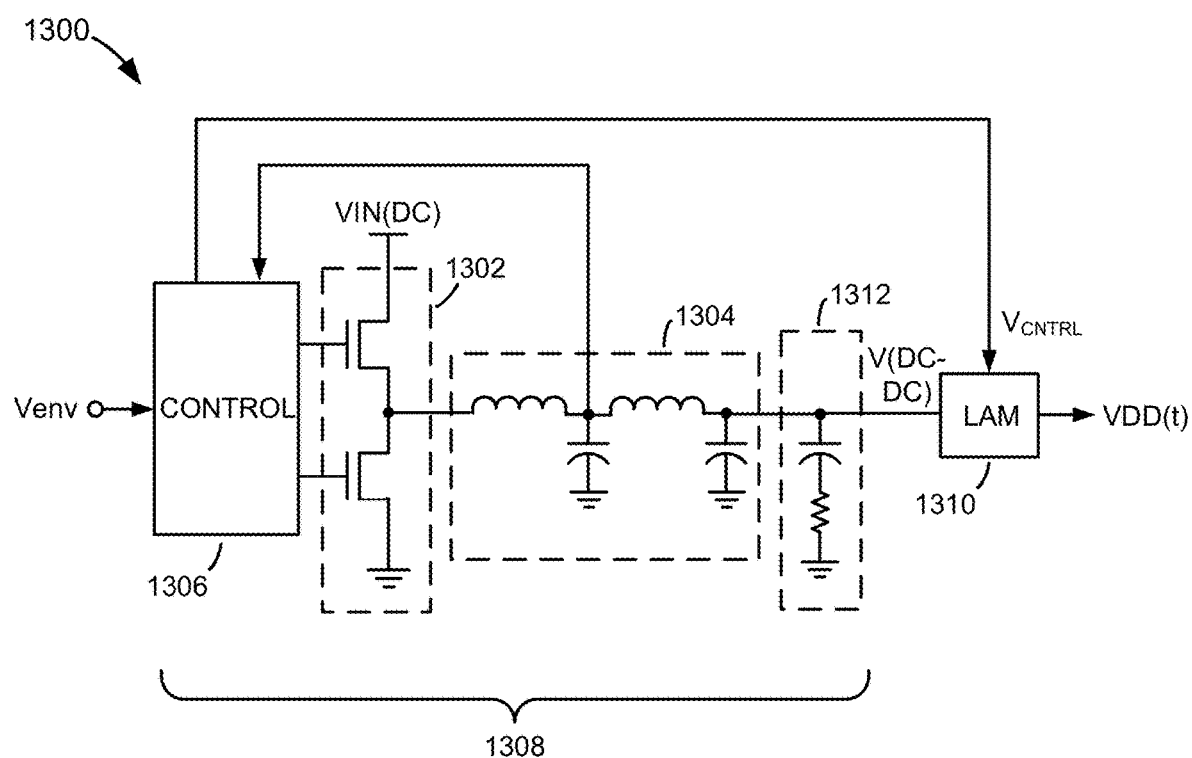
FIG. 13 is a drawing depicting a DPS, according to another embodiment of the invention.

As was explained above, in a preferred embodiment of the invention the DC-DC converter 402 is designed so that it operates open loop, i.e., without negative feedback. In circumstances where realizing the widest possible operating bandwidth is not of paramount importance, however, the DC-DC converter 402 can be configured to operate closed loop. FIG. 13 is a drawing depicting a DPS 1300 according to one embodiment of the invention that operates closed loop. Similar to the DPS 500 described above, the DPS 1300 comprises a DC-DC converter 1308 that includes a high-power buck switching stage 1302 and third-order or greater LPF 1304, and a LAM 1310. Negative feedback from the node that connects the two cascaded LC filters in the LPF 1304 to a feedback control input of the controller 1306 forces the DC-DC converter 1308 to operate closed loop. Similar to as in other embodiments of the invention the DPS 1300 further includes a damping network 1312 that dampens ringing at the DC-DC converter 1308/LAM 1310 interface and allows the controller 1306 to dynamically minimize the overhead voltage VDD(t)–V(DC-DC).

While various embodiments of the present invention have been presented, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments of the invention but, instead, should be determined by the appended claims, including the full scope of equivalents to which such claims are entitled.

What is claimed is:

1. A dynamic power supply (DPS), comprising:
   a direct current (DC)-DC converter configured to generate a DC-DC converter output voltage;
   a linear amplitude modulator (LAM) having a power supply input configured to receive the DC-DC converter output voltage; and
   a controller configured to dynamically control, according to time-varying changes in an input envelope voltage Venv, both switching of the DC-DC converter and a control voltage applied to a reference voltage input of the LAM,
   wherein the DC-DC converter comprises a high-power buck switching stage and an output network including a low-pass filter (LPF) configured to filter out switching noise produced by the high-power buck switching stage and a damping network that serves to reduce ringing at the power supply input of the LAM.

2. The DPS of claim 1, wherein the LPF comprises an LPF of order three or higher.

3. The DPS of claim 2, wherein the LPF comprises first and second sections and the DC-DC converter includes a negative feedback path between a node connecting the first and second sections of the LPF and a feedback control input of the controller.

4. The DPS of claim 2, wherein the LPF comprises a fourth-order LPF having first and second sections.

5. The DPS of claim 1, wherein the damping network comprises an R-C damping network coupled to an output of the LPF.

6. The DPS of claim 4, wherein the damping network comprises a first R-C damping network coupled to an output of the first section of the fourth-order LPF and a second R-C damping network coupled to an output of the second section of the fourth-order LPF.

7. The DPS of claim 1, wherein the DC-DC converter is configured to operate open loop.

8. The DPS of claim 1, wherein the controller is configured to control an overhead voltage dropped across a pass transistor in the LAM so that the overhead voltage always remains positive.

9. The DPS of claim 8, wherein the controller is further configured to dynamically control the overhead voltage so that the LAM operates near peak efficiency over time.

10. The DPS of claim 1, wherein the LAM comprises:
    an opamp having a reference voltage input terminal configured to receive the control voltage from the controller; and
    a power transistor having a gate or base coupled to the output of the opamp and a drain-source or collector-emitter path configured between the output of the DC-DC converter and the power supply input of the LAM.

11. The DPS of claim 10, wherein the power transistor comprises a gallium nitride high electron mobility transistor (GaN HEMT) and the opamp comprises a silicon opamp.

12. The DPS of claim 1, wherein the controller is further configured to increase an overhead voltage temporarily during times the DC-DC converter is unable to produce a low-magnitude output voltage.

13. The DPS of claim 1, wherein the controller is further configured to delay a dynamic reference voltage applied to the LAM and thereby account for a time delay experienced by a signal propagating through the DC-DC converter output network.

14. A method of generating a dynamic power supply (DPS) voltage, comprising:
    switching a direct current (DC)-DC converter according to time-varying changes of an input envelope voltage Venv to produce a DC-DC converter output voltage;
    filtering the DC-DC converter output voltage by a third-order or higher low-pass filter (LPF) to reduce a ripple voltage in the DC-DC converter output voltage;
    receiving the filtered DC-DC converter output voltage at a power supply input of a linear regulator; and
    further reducing ripple in the filtered DC-DC converter output voltage using a power supply rejection capability of the linear regulator.

15. The method of claim 14, further comprising controlling an overhead voltage dropped across a pass transistor in the linear regulator so that the linear regulator does not lose regulation.

16. The method of claim 15, wherein controlling the overhead voltage dropped across the pass transistor in the linear regulator comprises:
    generating a control voltage;
    applying the control voltage to a reference voltage input of an opamp in the linear regulator; and
    controlling the control voltage so that the overhead voltage dropped across the pass transistor in the linear regulator always remains positive.

17. The method of claim 16, wherein controlling the control voltage comprises delaying a control voltage waveform to account for a delay experienced by the DC-DC converter output voltage waveform when filtered by the third-order or higher LPF.

18. The method of claim 15, wherein controlling the overhead voltage further comprises increasing the overhead voltage temporarily during times switching the DC-DC converter is unable to produce a low-magnitude DC-DC converter output voltage.

19. The method of claim 14, wherein the DC-DC converter operates open loop to produce the DC-DC converter output voltage.

20. The method of claim 14, further comprising damping ringing at the power supply input of the linear regulator.

21. The method of claim 20, wherein damping ringing at the power supply input of the linear regulator comprises damping the filtered DC-DC converter output voltage produced by the third-order or higher LPF.

22. The method of claim 21, wherein damping the filtered DC-DC converter output voltage produced by the third-order or higher LPF comprises damping the filtered DC-DC converter output voltage using an R-C damping network.

23. The method of claim 20, wherein the third-order or higher LPF comprises a fourth-order LPF having first and second sections and damping ringing at the power supply input of the linear regulator comprises:
    damping ringing at an output node of the first section of the fourth-order LPF; and
    damping ringing at an output node of the second section of the fourth-order LPF.

24. The method of claim 23, wherein damping ringing at the output node of the first section of the fourth-order LPF comprises damping using a first R-C damping network.

25. The method of claim 24, wherein damping ringing at the output node of the second section of the fourth-order LPF comprises damping using a second R-C damping network.

* * * * *